United States Patent [19]

Birkle et al.

[11] Patent Number: 4,791,176

[45] Date of Patent: Dec. 13, 1988

[54] ALKENYLPHENOL AND ALKENYLPHENOL ETHER COPOLYMERS

[75] Inventors: Siegfried Birkle, Hoechstadt/Aisch; Recai Sezi, Roettenbach; Hans-Dieter Feucht, Erlangen, all of Fed. Rep. of Germany

[73] Assignee: Siemens Aktiengesellschaft, Müchen, Fed. Rep. of Germany

[21] Appl. No.: 166,437

[22] Filed: Mar. 10, 1988

[30] Foreign Application Priority Data

Mar. 11, 1987 [DE] Fed. Rep. of Germany ....... 3707843

[51] Int. Cl.[4] .............................................. C08F 30/08
[52] U.S. Cl. ................................ 525/326.5; 526/279; 526/313
[58] Field of Search ...................... 526/279, 313, 326.5

[56] References Cited

U.S. PATENT DOCUMENTS

| 3,125,554 | 3/1964 | Cooper et al. | 260/88.1 |
| 4,544,727 | 10/1985 | Ema et al. | 526/313 |
| 4,564,576 | 1/1986 | Saigo et al. | 526/279 |
| 4,704,438 | 11/1987 | Niwa et al. | 526/279 |

FOREIGN PATENT DOCUMENTS 1809948 6/1970 Fed. Rep. of Germany.
2446033 4/1976 Fed. Rep. of Germany.

Primary Examiner—C. Warren Ivy
Assistant Examiner—Alex H. Walker
Attorney, Agent, or Firm—Kenyon & Kenyon

[57] ABSTRACT

The invention relates to new copolymers of alkenyl phenol or alkenyl phenol ether in combination with alkenyl silanes. These copolymers are useful positive photoresists.

3 Claims, No Drawings

ALKENYLPHENOL AND ALKENYLPHENOL ETHER COPOLYMERS

FIELD OF THE INVENTION

This invention relates to copolymers of alkenylsilanes with either alkenylphenols or alkenylphenol ethers which are suitable for use as base polymers for dry-etch resistant, high resolution resists for UV-, Deep UV-, electron-, and roentgen-rays. In particular the invention relates to copolymers of vinylsilanes and either vinylphenol or vinylphenol ether.

BACKGROUND

Known resists for electronic components are often made of hardenable, silicon-containing polymers. These polymers, however, generally have low softening temperatures and poor film-forming properties. In addition, they may not be resistant to etching in an oxygen plasma. Finally, such polymers may not be compatible with photoreactive components or have good alkali solubility. As a result, such known silicon containing polymers may be unsuitable for use as base polymers for etch-resistant, high-resolution resists for UV-, Deep UV-, electron-, and roentgen-rays.

The object of this invention is to develop copolymers that have good solubility in different organic solvents such as alcohols, ketones, and esters. These copolymers, in addition, should have high softening temperatures and good film-forming properties. Due to their etching resistance in an oxygen plasma, their compatibility with photoreactive components, and good alkali solubility, the copolymers according to the invention should be suitable in particular for use as base polymers for dry-etch resistant, high-resolution resists for UV-, Deep UV-, electron-, and roentgen-rays.

SUMMARY OF THE INVENTION

These and other objects are achieved by the present invention which relates to alkenylphenol- and alkenylphenol ether-alkenylsilane copolymers. In particular, the invention relates to copolymers of vinylsilane and either vinylphenol or vinylphenol ether.

Preferred compounds are copolymers of vinylphenol, in particular p-vinylphenol, and vinyltrimethylsilane. Additional compounds are, for example copolymers with vinyltriethylsilane, vinyldiethylmethylsilane, vinyldimethylethylsilane, vinyldimethylphenylsilane, allyltrimethylsilane, allyltriethylsilane, allyl diethylmethylsilane, allyldimethylethylsilane, and allyldimethylphenylsilane.

DETAILED DESCRIPTION OF THE INVENTION

The new compounds are copolymers of alkenylsilanes and either alkenylphenols or alkenylphenol ethers, having the general formula:

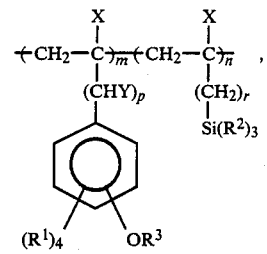

wherein $m+n$ is 1, p and r denote each 0, 1, or 2 (and that independently of each other), X=H, $CH_3$, $C_2H_5$ or halogen (that is F, Cl, Br, I),
Y=H, $CH_3$ or halogen,
$R^1$=H, halogen, alkyl (i.e. $CH_3$ and $C_2H_5$) or halogen alkyl,
$R^2$=H, $CH_3$, $C_2H_5$, $C_3H_7$ or $C_6H_5$,
$R^3$=H or R′,
R′ has the following meaning:
$CH_3$, $C_2H_5$, $C_3H_7$, $CH(CH_3)_2$, $C(CH_3)_3$, $C_6H_{11}$, $C_6H_5$, $CH_2C_6H_5$, $CH_2OCH_3$, $CH_2OCH_2CH_2OCH_3$, $Si(CH_3)_3$, and $Si(CH_3)_2C(CH_3)_3$, and wherein X, $R^1$, $R^2$ and $Y^3$ can be identical or different.

In the above formula m and n indicate the composition of the copolymers as amount of substance (mol fraction). The fraction of component m, i.e. the alkenylphenol(ether)-basic building block, here lies approximately in the range between 0.99 and 0.01.

In particular, the invention relates to copolymers of vinylsilane and either vinylphenol or vinylphenol ether of the general formula:

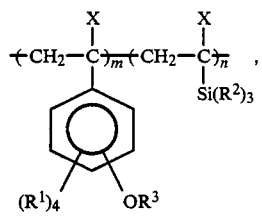

where $m+n=1$, and X, $R^1$, $R^2$ and $R^3$ have the previously indicated definitions.

The new vinyl compounds are manufactured through ionic copolymerization of vinylphenol ethers with non-hydrolyzable vinylsilanes; the corresponding vinylphenol copolymers originate from them by splitting the ether groups. During the ether splitting ether groups (—OR′) are converted into hydroxyl groups (—OH).

Preferred for the copolymerization as vinylphenol ethers are the o-, m-, or p-isomers of methoxystyrene, ethoxystyrene, propoxystyrene, isopropoxystyrene, t-butoxystyrene, phenoxystyrene, and benzyloxystyrene. The copolymerization itself takes place in the case of the vinyl compounds with known ionic initiators, preferentially with anionic initiators. Examples of such initiators are butyl lithium and naphthalene potassium. The fraction of the vinylsilane building block in the copolymer can in the anionic polymerization be purposefully controlled by varying the reaction parameters such as molar ratio of the monomeres, solvent and initiator.

The copolymerization, however, can also be carried out through radicals. In the case of allyl- (p and/or r=1) and butenyl compounds (p and/or r=2) it takes place preferentially in this manner. For the initiation, radical formers such as azo-isobutyronitrile and peroxides are used. In the radical copolymerization with vinylsilanes, copolymers with a small fraction (<10 mol percent) of vinyl silane monomers are obtained.

The copolymerization takes place in general in non-polar aprotic organic solvents, in particular in aliphatic or aromatic solvents like heptane and toluol. The reaction temperature can lie in the range between $-100°$ and $+100°$ C. The conversion takes place with good yield. The yield can be increased up to 100% if during copolymerization, catalytic quantities of an ether or a tertiary amine are added to the initiator solution. The product properties thereby are unchanged. Examples of such initiator mixtures are:

n-butyl lithium in heptane with the addition of tetrahydrofuran (molar ratio of n-BuLi:THF=1:1);

n-butyl lithium in hexane with the addition of tetramethylethylene diamine (molar ratio 1:1).

Cleaving the ether groups likewise takes place in an aprotic medium. For the ether cleavage, Lewis acids like boron tribromide are used. The hydroxyl groups created in the cleavage process lend to the copolymers according to the invention solubility in alkaline media. To protect the hydroxyl groups during the polymerization not only are ether groups suitable but in general such groups as are stable under the particular given polymerization conditions and which can be cleaved again following the copolymerization. Apart from ether groups, these are, for example, ester groups (see: T. W. Greene, "Protective Groups in Organic Synthesis", John Wiley & Sons, New York, 1981, pages 87 to 113 and pages 152 to 192). (*)

(*)Resist structures made of copolymers of the invention, as indicated in the foregoing objects, are disclosed in the simultaneously filed copending, U.S. Patent Application "Method for Generating Resist Structures" based on priority of German Patent Application No. P 37 07 841.0.

The invention will be explained in greater detail in conjunction with examples.

EXAMPLE 1

This example illustrates the preparation of a copolymer of p-vinylphenol and vinyltrimethylsilane. The following materials are successively added, while stirring, in a carefully dried two-necked glass flask under a dry, oxygen-free inert gas stream such as nitrogen: 26.8 g (200 mmol) of p-methoxy styrene freed of inhibitors, distilled over $CaH_2$; 10 g (100 mmol) freshly distilled vinyltrimethylsilane; 34 ml absolute toluene; and 1.1 g (17 mmol) n-butyl lithium (in hexane). The flask is then immediately closed with a flap valve filled with paraffin oil. Subsequently, the flask is placed into a thermostat brought to 25° C. After 20 hours the polymerization is stopped through the addition of 1 to 2 ml methanol. The reaction solution is placed into a drip funnel and slowly dripped while being vigorously agitated into a ten-fold volume of methanol. The reaction product precipitating as white flocculent substance is filtered off and dried at 50° C. in a vacuum drying cabinet until it reaches constant weight. Yield: 16.56 g (45% theoretical). The copolymer obtained in this way consists of 58 mol percent of methoxystyrene and 42 mole percent of vinyl trimethyl silane basic building blocks.

In a dry three-necked round flask with an internal thermometer, agitator, and cooler with drying tube, 10 g of the copolymer produced in the above described manner are dissolved in 150 ml dry dichloromethane and cooled in a cooling bath to approximately $-80°$ C. A solution of 16.2 g boron tribromide in 50 ml dry dichloromethane cooled to $-80°$ C. is slowly added. The reaction solution is then warmed to room temperature over three hours while stirring. In the process the solution turns reddish brown. Approximately 5 ml of water are added and mixed vigorously, forming a sticky substance which floats on the surface of the liquid. After adding 100 ml 10% caustic soda solution the sticky substance dissolves in the aqueous alkaline phase. The organic phase is separated in a separatory funnel from the NaOH phase and washed with NaOH 2 to 3 times. The combined NaOH extracts are acidified with hydrochloric acid, taken up in ethylacetate, washed with distilled water, dried over sodium sulfate, and precipitated with the ten-fold quantity of petroleum ether. The resulting product is dried in a vacuum drying cabinet at 50° C. until it reaches constancy of weight. Yield: 7.07 g (76% theoretical).

The obtained copolymer of p-vinylphenol and vinyltrimethylsilane is soluble in caustic soda solution and ethylacetate, as well as cyclohexanone and 2-ethoxyethylacetate. The molecular weight determined osmometrically is 2400. The uniformity determined by gel permeation chromatography is 1.2. The copolymer softens (in a heated microscope) at approximately 155° C. From the NMR spectrum it is apparent that the eter cleavage was quantitative.

EXAMPLE 2

The following materials are successively added into a flask and polymerized at 25° C. according to Example 1: 26.8 g (200 mmol) of p-methoxy styrene freed of inhibitors, distilled over $CaH_2$; 20 g (200 mmol) freshly distilled vinyltrimethylsilane; 44 ml absolute heptane; and 1.4 g (22 mmol) n-butyl lithium (in the form of a 1.6 molar solution in hexane). After 6 hours the polymerization is stopped through the addition of 2 ml methanol. The reaction solution is then placed into a drip funnel. While being stirred vigorously it is slowly dripped into a ten-fold volume of methanol. The reaction product precipitating in the process is filtered off and dried at 50° C. in a vacuum drying cabinet until constancy of weight occurs. Yield: 15 g (32% theoretical). The copolymer obtained in this manner contains 45 mol percent methoxystyrene and 55 mol percent vinyltrimethylsilane.

The cleavage of ether groups is carried out according to Example 1. For this purpose 1 to 1.3 mole boron tribromide per mol of methoxystyrene are used. The yield is 84% of the theoretical yield, relative to the isolated quantity of copolymer consisting of p-vinylphenol and vinyltrimethylsilane. From the NMR spectrum it is evident that splitting of the ether took place quantitatively. The copolymer has a molecular weight of 5000 (determined osmometrically), and is soluble in caustic soda solution (2n), 2-ethoxyethyl acetate and cyclohexanone. Under a heated microscope no softening is detected up to 200° C.

EXAMPLE 3

The following materials are successively added into a flask and polymerized at 25° C. according to Example 1: 13.4 g (100 mmol) of p-methoxystyrene freed of inhibitors, distilled over $CaH_2$; 10 g (100 mmol) freshly distilled vinyl trimethyl silane; 22 ml absolute tetrahydrofuran; and 0.7 g (11 mmol) n-butyllithium (in the form of a 1.6 molar solution in hexane). After 6 hours the polymerization is stopped through the addition of 1 ml methanol. The reaction solution is then placed into a drip funnel and slowly dripped into a ten-fold volume of methanol while being stirred vigorously. The reaction product precipitates as flocculent substance and is filtered off, washed with methanol, and dried in a vacuum drying cabinet at 50° C. until it reaches constancy of weight. Yield: 5.6 g (24% theoretical). The copolymer thus obtained consists of 85 mol percent of methoxystyrene and 15 mole percent of vinyltrimethylsilane.

The following splitting of ether is carried out according to example 1. The yield is 75% of the theoretical yield relative to the isolated quantity of copolymer. The copolymer of p-vinylphenol and vinyltrimethylsilane is soluble in caustic soda solution (2n), cyclohexanone, and 2-ethoxyethyl acetate. The molecular weight determined osmometrically is 1400. The NMR spectrum indicates that the ether cleavage was quantitative.

EXAMPLE 4

In accordance with Example 1, the following materials are successively combined in a flask: 5.7 g (43 mmol) of p-methoxystyrene freed of inhibitors, distilled over $CaH_2$; 4.3 g (43 mmol) freshly distilled vinyltrimethylsilane; and 22 ml absolute tetrahydrofuran. The closed flask is then placed in a thermostat brought to −60° C. After 1 hour, when the temperature inside the flask has reached −60° C., 0.14 g (0.86 mmol) naphthalene potasium are added while stirring. After 16 hours the polymerization is stopped through the addition of 1 ml methanol. The reaction solution is placed into a drip funnel and dripped slowly while being vigorously stirred into a ten-fold volume of methanol. The reaction product, which precipitates as flocculent substance, is filtered off, washed with methanol, and dried in a vacuum drying cabinet at 50° C. until weight constancy is reached. Yield: 6.4 g (64% of theoretical). The obtained copolymer consists of 79 mol percent methoxystyrene and 21 mol percent vinyl-trimethylsilane basic building blocks.

The subsequent ether group cleavage is carried out according to Example 1. The yield is 85% of the theoretical yield relative to the isolated quantity of copolymer. The copolymer of p-vinylphenol and vinyltrimethylsilane is soluble in caustic soda solution (2n), cyclohexanone, and 2-ethoxyethyl acetate.

EXAMPLE 5

In accordance with Example 1, the following materials are successively combined in a flask: 138 g (1.03 mol) of p-methoxystyrene, freed of inhibitors, distilled over $CaH_2$; 77 g (0.77 mole) freshly distilled vinyltrimethylsilane; and 280 ml absolute toluene. The closed flask is then placed into a thermostat at 0° C. After 1 hour 11.5 g (0.18 mol) n-butyl lithium (in hexane) are added while stirring. After 70 hours the polymerization is stopped by adding 10 ml methanol. The reaction solution is poured into a drip funnel, and dripped slowly while being stirred vigorously into a ten-fold volume of methanol. The reaction product precipitating as white sticky substance is filtered off, and dried at 50° C. in a vacuum drying cabinet until it reaches constant weight. Yield: 176 g (82% of the theoretical). The copolymer obtained in this way consists of 54 mol percent methoxystyrene and 46 mol percent vinyltrimethylsilane basic building blocks.

In a three-necked flask (see Example 1) under inert gas 160 g of the copolymer prepared in the manner described above are dissolved in 2 liters dry dichloromethane and cooled in a cooling bath to approximately −60° C. A non-cooled solution of 240 g boron tribromide in 200 ml dry dichloromethane is then slowly added and the reaction solution is permitted to warm up to room temperature over three hours while being stirred. The solution turns yellowish in the process. It is then mixed with approximately 90 ml water and stirred vigorously, in the process of which a sticky substance floating on the surface of the liquid forms. After addition of 2 1 10% caustic soda solution the sticky substance dissolves in the aqueous alkaline phase. The organic phase is separated in a separatory funnel from the NaOH phase and washed 2 to 3 times with NaOH. The combined NaOH extracts are acidified with hydrochloric acid, taken up in ethylacetate, washed with distilled water, dried over sodium sulfate, and then precipitated with the ten-fold quantity of petroleum ether. The obtained product is dried in a vacuum drying cabinet at 50° C. until it reaches constant weight. Yield: 129 g (86% of the theoretical).

The obtained copolymer of p-vinylphenol and vinyltrimethyl silane is soluble in caustic soda solution and ethyl acetate, as well as 2-ethoxyethyl acetate. The molecular weight determined osmometrically is 2600. The uniformity determined by gel permeation chromatography is 1.2. The copolymer softens (in a heated microscope) at approximately 155° C. The NMR spectrum indicates that the ether cleavage took place quantitatively.

We claim:

1. A copolymer of alkenyl silane and alkenyl phenol or alkenyl phenolether having the general formula

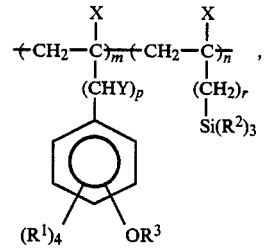

wherein:
m+n is 1;
p and r each independently denote 0, 1, or 2;
X is H, $CH_3$, $C_2H_5$ or halogen;
Y is H, $CH_3$ or halogen;
$R^1$ is H, halogen, alkyl or halogen alkyl;
$R^2$ is H, $CH_3$, $C_2H_5$, $C_3H_7$ or $C_6H_5$;
$R^3$ is H or R';
R' is $CH_3$, $C_2H_5$, $C_3H_7$, $CH(CH_3)_2$, $C(CH_3)_3$, $C_6H_{11}$, $C_6H_5$, $CH_2C_6H_5$, $CH_2OCH_3$, $CH_2OCH_2CH_2OCH_3$, $Si(CH_3)_3$, or $Si(CH_3)_2C(CH_3)_3$; and said X, $R^1$, $R^2$ and Y being identical or different.

2. Vinylphenol- and vinylphenolether-vinyl silane copolymers according to claim 1 wherein both of p and r are 0.

3. The copolymer of vinyl phenol and vinyl trimethylsilane according to claim 1.

* * * * *